(12) United States Patent
Liao et al.

(10) Patent No.: US 12,412,544 B2
(45) Date of Patent: Sep. 9, 2025

(54) NON-VOLATILE FERROELECTRIC CAPACITOR AND DISPLAY DRIVING CIRCUIT

(71) Applicant: XIDIAN UNIVERSITY, Shaanxi (CN)

(72) Inventors: Jiajia Liao, Shaanxi (CN); Yichun Zhou, Shaanxi (CN); Min Liao, Shaanxi (CN)

(73) Assignee: XIDIAN UNIVERSITY, Xi'an (CN)

( * ) Notice: Subject to any disclaimer, the term of this patent is extended or adjusted under 35 U.S.C. 154(b) by 0 days.

(21) Appl. No.: 18/668,528

(22) Filed: May 20, 2024

(65) Prior Publication Data

US 2024/0304159 A1     Sep. 12, 2024

Related U.S. Application Data

(63) Continuation of application No. PCT/CN2022/108598, filed on Jul. 28, 2022.

(30) Foreign Application Priority Data

Nov. 22, 2021  (CN) .......................... 202111388892.3

(51) Int. Cl.
*G09G 3/36* (2006.01)
*H10B 53/30* (2023.01)

(52) U.S. Cl.
CPC ......... *G09G 3/3651* (2013.01); *G09G 3/3677* (2013.01); *G09G 3/3688* (2013.01); *H10B 53/30* (2023.02); *G09G 2300/0842* (2013.01); *G09G 2330/021* (2013.01)

(58) Field of Classification Search
None
See application file for complete search history.

(56) References Cited

U.S. PATENT DOCUMENTS

| | | | |
|---|---|---|---|
| 2001/0007447 A1* | 7/2001 | Tanaka ................. | G09G 3/3258 345/87 |
| 2004/0124442 A1* | 7/2004 | Koyama ................ | H10D 86/60 257/E27.113 |
| 2006/0181486 A1* | 8/2006 | Tseng ................... | G09G 3/3233 345/55 |

FOREIGN PATENT DOCUMENTS

| | | | |
|---|---|---|---|
| CN | 1512224 A | 7/2004 | |
| CN | 107248393 A | 10/2017 | |
| CN | 107248393 B * | 4/2019 | .......... G09G 3/3225 |

(Continued)

OTHER PUBLICATIONS

International Search Report of PCT/CN2022/108598.
Written Opinion of PCT/CN2022/108598.

*Primary Examiner* — Kirk W Hermann

(57) ABSTRACT

There is provided a non-volatile ferroelectric capacitor and a display driving circuit. The non-volatile ferroelectric capacitor comprises: a ferroelectric capacitor, which is formed on the surface of a substrate; and a first channel layer and a second channel layer, which are respectively formed on the surface of the substrate. The ferroelectric capacitor comprises a bottom electrode, a ferroelectric thin film and a top electrode, which are sequentially arranged in a stacked manner; the first channel layer is in contact with the bottom electrode; a dielectric material is formed on the surfaces of the ferroelectric capacitor, the first channel layer and the second channel layer; and a first gate electrode and a second gate electrode are formed on the surface of the dielectric material, such that the structure of the ferroelectric capacitor is obtained.

12 Claims, 7 Drawing Sheets

(56) References Cited

FOREIGN PATENT DOCUMENTS

| | | | |
|---|---|---|---|
| JP | 2002169181 A | | 6/2002 |
| JP | 2006064731 A | * | 3/2006 |
| JP | 2006253295 A | | 9/2006 |
| KR | 20000062108 A | * | 10/2000 |

* cited by examiner

NON-VOLATILE FERROELECTRIC CAPACITOR AND DISPLAY DRIVING CIRCUIT

CROSS-REFERENCE TO RELATED APPLICATIONS

This is a continuation of the International Patent Application No. PCT-CN2022-108598, which claims the priority of Chinese Patent Application No. 2021113888923 filed with the China National Intellectual Property Administration on Nov. 22, 2021 and entitled "Non-volatile Ferroelectric Capacitor and Display Driving Circuit", and the entire contents of which are hereby incorporated by reference.

TECHNICAL FIELD

The present disclosure relates to the technical field of display driving, and particularly relates to a non-volatile ferroelectric capacitor and a display driving circuit.

BACKGROUND

As the main means of presenting information in today's society, electronic displays constitute one of the important components in the information field. They are mainly used in mobile phone screens, computer screens, electronic billboards, large conference displays, important transportation hub displays, etc. Compared with traditional paper newspapers or billboards, they are more environmentally friendly and erasable, and are expected to replace traditional paper newspapers or billboards in the future.

Currently, display screens mainly include liquid crystal displays (LCDs) and organic light-emitting diode (OLED) displays, where the LCDs have the advantages of super-large-area integration and full-color display, but due to the hysteresis effect of liquid crystal molecule rotation, the response is relatively slow. In contrast, the OLEDs have the advantages of self-illumination, bright colors, wide viewing angles, foldability, thinness and so forth, and are mainly used in mobile phones, wearable electronic devices, virtual reality (VR), and other fields. The OLEDs further include active-matrix organic light-emitting diodes (AMOLEDs). In terms of the operating principle, both the LCDs and the AMOLED displays control the opening of gate transistors through data lines and selection lines, the gate transistors are capable of charging storage capacitors, and voltages at both ends of the storage capacitors are capable of controlling the polarity of liquid crystal capacitors in the LCDs or source-drain currents of driving transistors in the OLEDs, so that gray scales of organic light-emitting layers can be controlled.

With the continuous miniaturization of portable electronic devices and the increasingly enhanced awareness of energy conservation, improving display quality while reducing power consumption has become one of the important goals in the display field. However, the storage capacitors in the prior art usually are volatile capacitors, and their dielectric materials include silicon nitride, hafnium oxide, etc. When an electric field is removed, electric discharging starts, and its charge can be maintained for only 1-2 ms, so that constant refreshing is needed (charging the capacitor with new signal pulses) to maintain the continuity of images. For the same image, a driving circuit in the prior art is volatile and the storage capacitor needs to be continuously charged to maintain the original image. Further, once the voltage is removed, originally inputted image information is lost and needs to be rewritten.

The storage capacitors of both the LCD and the OLED are volatile, and after a power supply is disconnected, the voltages at both ends thereof can be maintained for only 1-2 ms, resulting in that a display screen will lose brightness. "Static" displays, such as electronic newspapers and electronic advertising displays, do not require real-time updating of display images, but due to the volatility of the storage capacitors, in order to maintain the contents of the display screens, the driving circuits still need to be refreshed in real time to continuously charge the storage capacitors, and each stage of driving will cause a large power loss.

SUMMARY

An objective of the present disclosure is to provide a non-volatile ferroelectric capacitor and a display driving circuit and obtain new non-volatile display driving technology with low power consumption and high display quality by integrating the non-volatile ferroelectric capacitor into the display driving circuit.

In order to solve the above problems, the present disclosure provides a non-volatile ferroelectric capacitor, including: a substrate; a ferroelectric capacitor, which is formed in the middle of a surface of the substrate; and a first channel layer and a second channel layer, which are respectively formed on both sides of the surface of the substrate. The ferroelectric capacitor includes a bottom electrode, a ferroelectric thin film and a top electrode, which are sequentially arranged in a stacked manner, where the first channel layer is in contact with the bottom electrode. A dielectric material is formed on the surfaces of the ferroelectric capacitor, the first channel layer and the second channel layer. A first gate electrode and a second gate electrode are formed on the surface of the dielectric material, such that the structure of the ferroelectric capacitor is obtained. The structure of the ferroelectric capacitor is provided with a first groove, a second groove, a third groove, a fourth groove, a fifth groove, a sixth groove and a seventh groove, where the first channel layer is at the bottom of the first groove and the second groove, the first gate electrode is at the bottom of the third groove, the second channel layer is at the bottom of the fourth groove and the fifth groove, the second gate electrode is at the bottom of the sixth groove, and the top electrode is at the bottom of the seventh groove.

Optionally, the first gate electrode is directly opposite to the first channel layer, and the second gate electrode is directly opposite to the second channel layer; and an area of the first gate electrode is smaller than the area of the first channel layer, and the area of the second gate electrode is smaller than the area of the second channel layer.

Optionally, a passivation layer is deposited on the structure of the ferroelectric capacitor.

Optionally, metal is deposited in the first groove, the second groove, the third groove, the fourth groove, the fifth groove, the sixth groove and the seventh groove.

Optionally, the substrate includes one of a glass sheet, a flexible mica sheet, a Polydimethylsiloxane (PDMS) substrate, a polyimide (PI) substrate, and a quartz sheet.

Optionally, a buffer layer is arranged between the substrate and the ferroelectric capacitor; and the buffer layer is made of one of silicon nitride, silicon oxide and aluminum oxide, or is a substrate interface layer obtained after treatment with plasmas.

Optionally, the bottom electrode is made of one of Pt, Ir, W, Ni, TiN, TaN, HfNx, ITO, ZnO, poly-Si, silver nanowires and graphene.

Optionally, the ferroelectric thin film is made of one of hafnium oxide-based ferroelectric materials, PZT, SBT, PVDF and BNT.

Optionally, the top electrode is made of one of Pt, Ir, W, Ni, TiN, aN, HfNx, ITO, ZnO, poly-Si, silver nanowires and graphene.

Optionally, the first channel layer and the second channel layer are made of one of amorphous silicon, polysilicon, ZnO, IGZO, IZO, AZO and carbon nanotubes.

Optionally, the dielectric material is made of one or more of $SiO_2$, $Si_3N_4$, $HfO_2$, $ZrO_2$, $Al_2O_3$, $La_2O_3$, $Y_2O_3$ and $TiO_2$.

Optionally, the first gate electrode and the second gate electrode are made of one of Pt, Ir, W, Ni, TiN, TaN, HfNx, ITO, ZnO, poly-Si, silver nanowires and graphene.

According to an aspect of the present disclosure, the present disclosure further provides a display driving circuit, including a selection transistor, a ferroelectric capacitor and a liquid crystal capacitor, where a gate electrode of the selection transistor is connected to a scan line, a source electrode of the selection transistor is connected to a data line, one end of the ferroelectric capacitor is connected to the scan line, the other end of the ferroelectric capacitor is grounded, one end of the liquid crystal capacitor is connected to the scan line, the other end of the liquid crystal capacitor is grounded, and both ends of the ferroelectric capacitor are connected with both ends of the liquid crystal capacitor.

According to another aspect of the present disclosure, the present disclosure further provides a display driving circuit, including a selection transistor, a ferroelectric capacitor and a driving transistor, where a gate electrode of the selection transistor is connected to a scan line, a source electrode of the selection transistor is connected to a data line, a drain electrode of the selection transistor is connected to the ferroelectric capacitor, both ends of the ferroelectric capacitor are respectively connected to the source electrode and the gate electrode of the driving transistor, and the drain electrode of the driving transistor is grounded.

The above technical solution in the present disclosure has the following beneficial effects:

(1) The non-volatile ferroelectric capacitor of the present disclosure is integrated into a liquid crystal display (LCD) or active-matrix organic light-emitting diode (AMOLED) display driving circuit. Due to the effect of the ferroelectric thin film material in the non-volatile ferroelectric capacitor, a polarization state pre-written after an electric field is removed can still be saved, which realizes non-volatile display while reducing the power consumption of screen display. The ferroelectric capacitor is formed by a sandwich structure of "electrode/ferroelectric thin film/electrode", where the electrode is a material with good conductivity and a certain transparency, and the ferroelectric thin film is a transparent or semi-transparent material.

(2) For the LCD technology, both ends of the ferroelectric capacitor are connected to both ends of the liquid crystal capacitor, and one end of the ferroelectric capacitor is connected to the drain electrode of a gate transistor. For the AMOLED technology, both ends of the ferroelectric capacitor are connected to the gate and source electrodes, or the gate and drain electrodes of the driving transistor, and one end of the ferroelectric capacitor is connected to the drain electrode of the gate transistor.

Further, when the ferroelectric capacitor is integrated into the AMOLED display driving circuit, the preparation of the ferroelectric capacitor can be performed before the preparation of the gate transistor and the driving transistor, or after the preparation of the gate transistor and the driving transistor, as well as a source region and a drain region, which specifically depends on the types of the ferroelectric material and transistor channels and also thermal budget requirements.

When the ferroelectric capacitor is integrated into the display driving circuit and the image needs to be updated, the scan line of the gate transistor is first turned on, a data line signal of the gate transistor is inputted to erase the polarization state of the ferroelectric capacitor and make the net remanent polarization charge be zero, and then another data line signal is applied to write a new polarization state for the ferroelectric capacitor.

An area of the ferroelectric capacitor of the present disclosure is 20%-80% of that of the volatile capacitor in the prior art. In view of the shortcomings that the display driving circuits in the prior art are volatile and need to be refreshed in real time, a driving circuit based on a non-volatile ferroelectric capacitor is designed, that is, the ferroelectric capacitor is used as a storage capacitor to solve the problem of large energy consumption of existing "static" electronic displays. Further, due to a fast speed of erasing and writing and a low power consumption of the ferroelectric capacitor, the power consumption of the electronic display can be further reduced. Further, since the ferroelectric polarization intensity is much higher than that of ordinary dielectric materials, the area of the storage capacitor can be further reduced, which is beneficial to increasing an aperture opening ratio.

DETAILED DESCRIPTIONS OF THE EMBODIMENTS

For making the objectives, technical solutions and advantages of the present disclosure clearer, the present disclosure will be described in further detail below in conjunction with the specific embodiments with reference to the accompanying drawings. It is to be understood that these descriptions are merely illustrative and not intended to limit the scope of the present disclosure. Moreover, in the following explanation, descriptions of well-known structures and techniques are omitted to avoid unnecessarily obscuring the concepts of the present disclosure.

The present disclosure will be elaborated hereafter in conjunction with the accompanying drawings and embodiments.

Embodiment 1

In this embodiment, the present disclosure provides a display driving circuit. Different from the display driving circuits in the prior art, the display driving circuit of this embodiment integrates a ferroelectric capacitor that is non-volatile. The characteristics of a ferroelectric thin film material in the non-volatile ferroelectric capacitor enable that a polarization state pre-written after an electric field is removed can still be saved, which realizes non-volatile display while reducing the power consumption of screen display.

Figure 1:
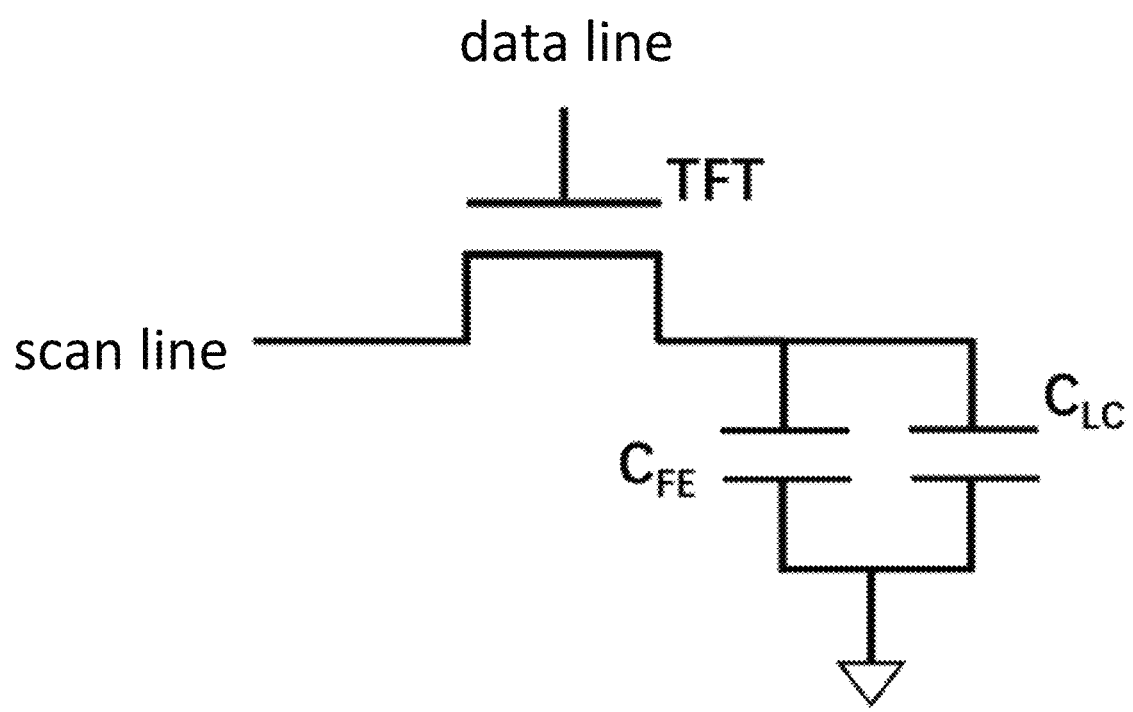
FIG. 1 is an equivalent circuit diagram of a ferroelectric capacitor integrated into a liquid crystal display (LCD) driving circuit provided by the present disclosure.
Figure 2:
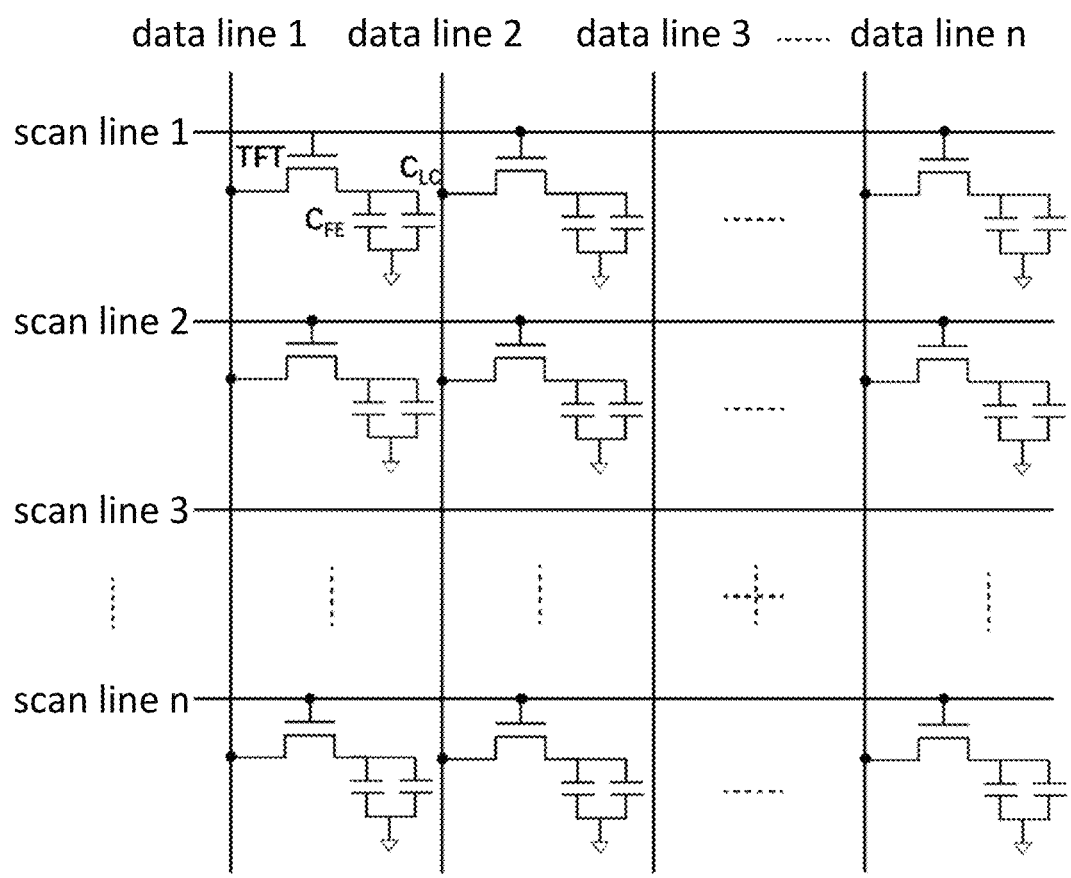
FIG. 2 is a diagram of an LCD driving circuit based on a ferroelectric capacitor provided by the present disclosure.

Specifically, FIG. 1 is an equivalent circuit diagram of a ferroelectric capacitor integrated into a liquid crystal display (LCD) driving circuit, and FIG. 2 is a diagram of an LCD driving circuit based on a ferroelectric capacitor. As shown in FIGS. 1 and 2, a display driving circuit provided by the present disclosure includes a selection thin-film transistor (TFT), a ferroelectric capacitor ($C_{FE}$) and a liquid crystal capacitor ($C_{LC}$).

A gate electrode of the selection TFT is connected to a scan line, a source electrode of the selection TFT is connected to a data line, one end of the $C_{FE}$ is connected to the scan line, the other end of the $C_{FE}$ is grounded, one end of the $C_{LC}$ is connected to the scan line, the other end of the $C_{LC}$ is grounded, and both ends of the $C_{FE}$ are connected with both ends of the $C_{LC}$.

Voltages at both ends of the $C_{LC}$ in the LCD are used to control the arrangement of liquid crystal molecules in the liquid crystal, and combined with corresponding color filters, different grayscale colors be can presented. An LCD pixel includes three liquid crystal units (red, green and blue), and a liquid crystal unit includes a display driving circuit. By controlling the voltages of the three liquid crystal units, colors of different shades are mixed to form the desired various colors required.

The selection TFT is configured to control the gray scale of the liquid crystal unit, the $C_{FE}$ is configured for non-volatile storage, and the electric charge stored therein or the voltages at both ends thereof are determined by the amount of electricity charged when the selection TFT is turned on. The $C_{LC}$ is also configured to control the gray scale of the liquid crystal unit, and when the selection TFT is turned off, the $C_{FE}$ is still capable of controlling the voltages at both ends of the $C_{LC}$, so that the written image can be maintained.

As shown in FIG. 2, a specified voltage is first set for the data lines of each column, and then pulses are applied to the scan line of an initial row to gate all the selection TFTs of the initial row. For a display with a frequency of 60 Hz and a resolution of 1024*768, a pulse width assigned to each row of scan line is about 16.67 ms/768=21.7 us, and the $C_{LC}$s connected with them in series are charged to a voltage corresponding to the gray scale within a certain period of time. When the $C_{LC}$s on the initial row are fully charged, the next row of scan line is turned on. The signal of the data line of the corresponding selection TFT in the next row (set to a specified voltage) is inputted, and at the same time, the scan line is turned on to charge the $C_{FE}$s, and the signals of each row are sequentially stored in the corresponding $C_{FE}$S. In this way, the signals are written line by line until the signal of the last line of scan line is inputted, and a complete frame of image is displayed after the whole process is completed. The time spent is determined by the screen refresh rate.

Both the data line and the scan line are connected to a terminal, the gray scale of each color point unit can be controlled by programming the data line of the terminal, and the refreshing of each row of scan line can be controlled by programming the scan line of the terminal.

When the voltages of the scan line and the data line are released, the $C_{FE}$ and the $C_{LC}$ are connected in series, and the voltages at both ends of the $C_{FE}$ determine the orientation of the liquid crystal molecules in the $C_{LC}$, thereby determining its gray scale.

However, each row of scan line is applied by microseconds, the polarization reversal of the ferroelectric thin film usually occurs at the nanometer level, and once the reversal is performed, even if the voltage is released, the polarization charge can still be retained, so that the display driving circuit integrated with the ferroelectric capacitor of the present disclosure is capable of reducing the power consumption of writing each frame of image.

Further, in order to ensure the brightness of the LCD display screen, the $C_{FE}$S are all made of transparent or semi-transparent materials.

Preferably, the $C_{FE}$ is of a sandwich structure of "upper electrode/ferroelectric thin film/lower electrode", where the upper electrode or the lower electrode is made of ITO, ZnO, TiN, silver nanowires, graphene, etc., and the ferroelectric thin film is made of one of hafnium oxide-based ferroelectric materials, PZT, SBT, PVDF, BNT, etc.

Embodiment 2

In this embodiment, the present disclosure provides a display driving circuit. Different from the display driving circuits in the prior art, the display driving circuit of this embodiment integrates a ferroelectric capacitor that is non-volatile. The characteristics of a ferroelectric thin film material in the non-volatile ferroelectric capacitor enable that a polarization state pre-written after an electric field is removed can still be saved, which realizes non-volatile display while reducing the power consumption of screen display.

Figure 3:
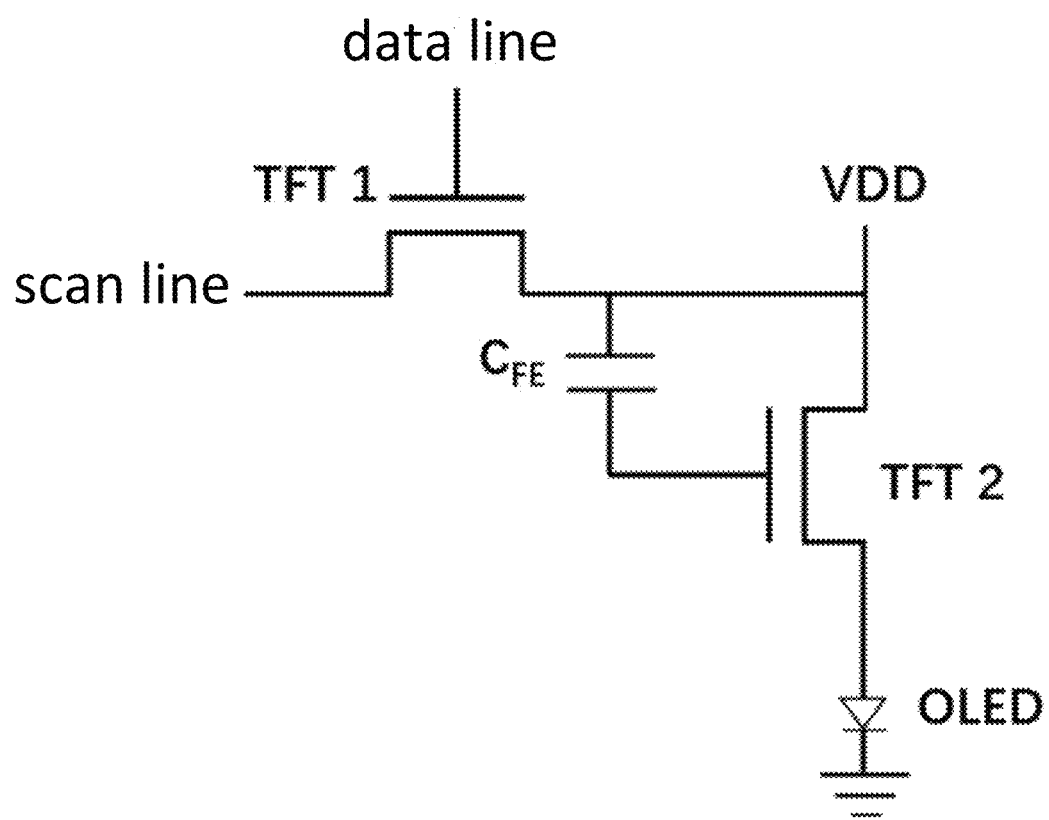
FIG. 3 is an equivalent circuit diagram of a ferroelectric capacitor integrated into an active-matrix organic light-emitting diodes (AMOLED) driving circuit provided by the present disclosure.
Figure 4:
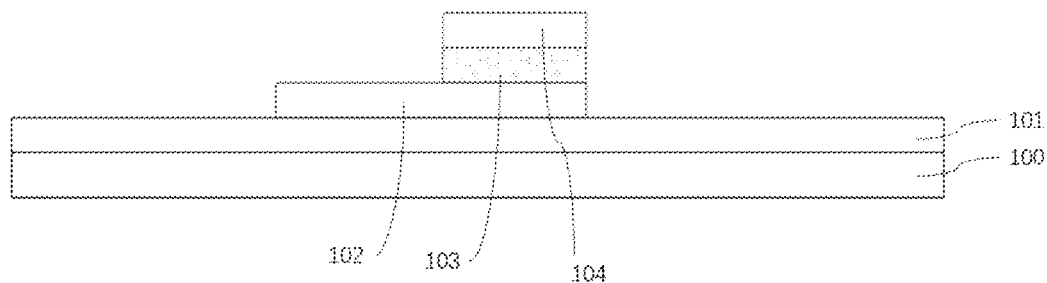
FIG. 4 is a structural schematic diagram of a non-volatile ferroelectric capacitor prepared in step 1 provided by the present disclosure.
Figure 5:
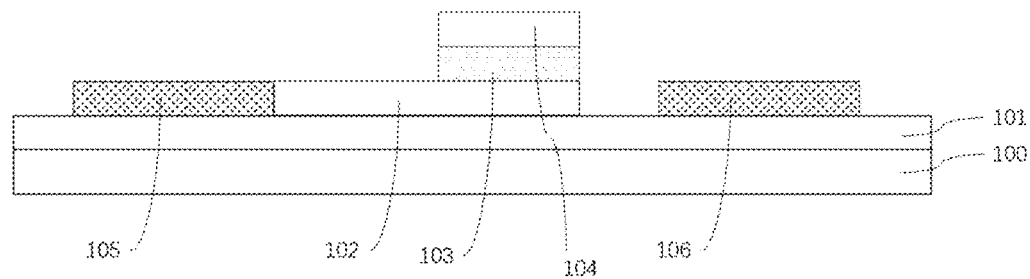
FIG. 5 is a structural schematic diagram of a non-volatile ferroelectric capacitor prepared in step 2 provided by the present disclosure.
Figure 6:
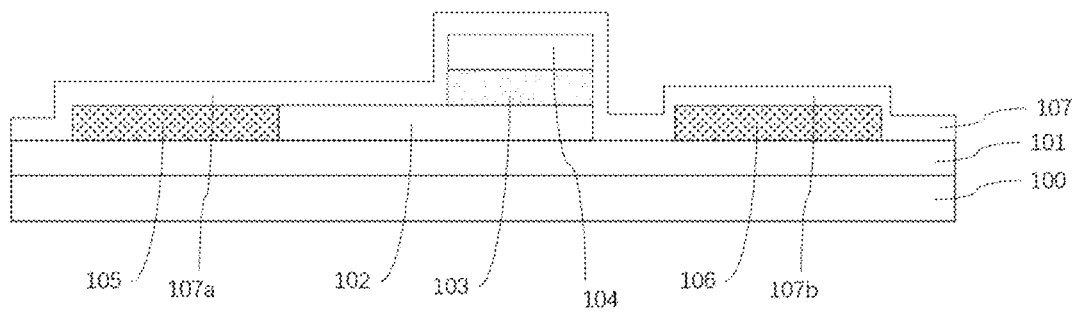
FIG. 6 is a structural schematic diagram of a non-volatile ferroelectric capacitor prepared in step 3 provided by the present disclosure
Figure 7:
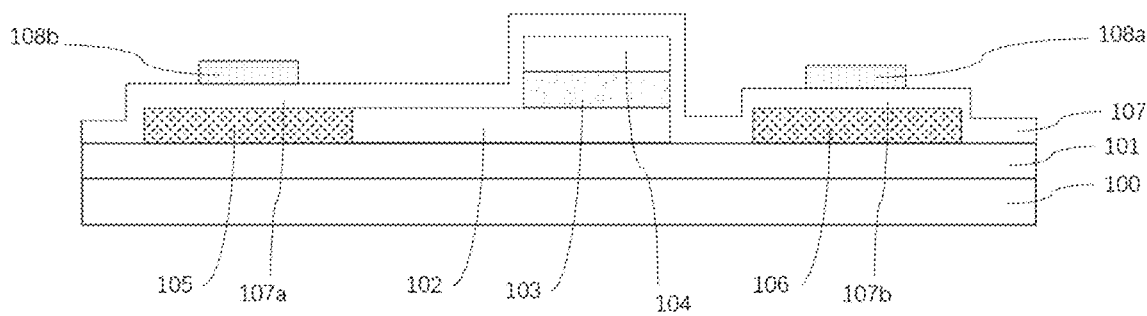
FIG. 7 is a structural schematic diagram of a non-volatile ferroelectric capacitor prepared in step 4 provided by the present disclosure.
Figure 8:
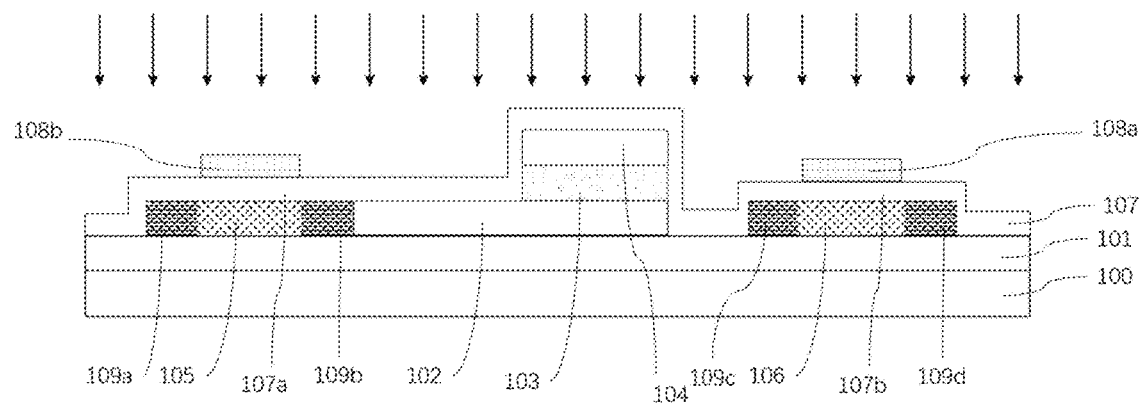
FIG. 8 is a structural schematic diagram of a non-volatile ferroelectric capacitor prepared in step 5 provided by the present disclosure.
Figure 9:
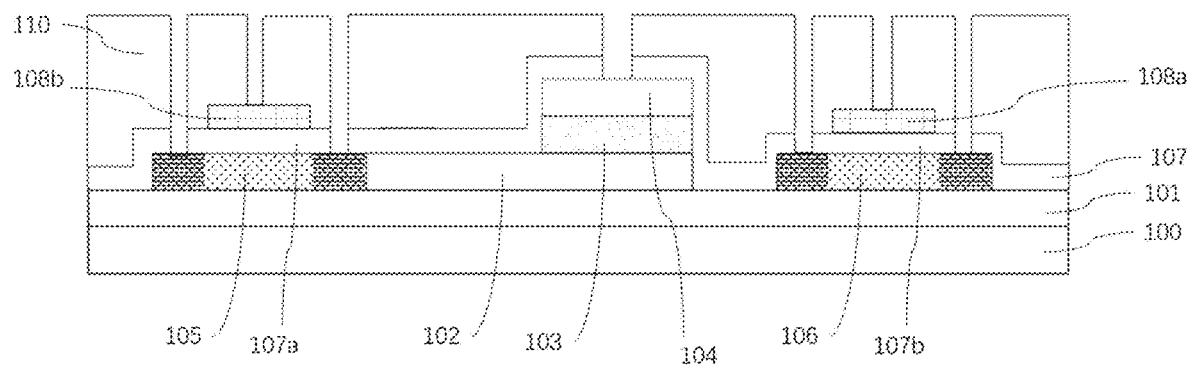
FIG. 9 is a structural schematic diagram of a non-volatile ferroelectric capacitor prepared in step 6 provided by the present disclosure.
Figure 10:
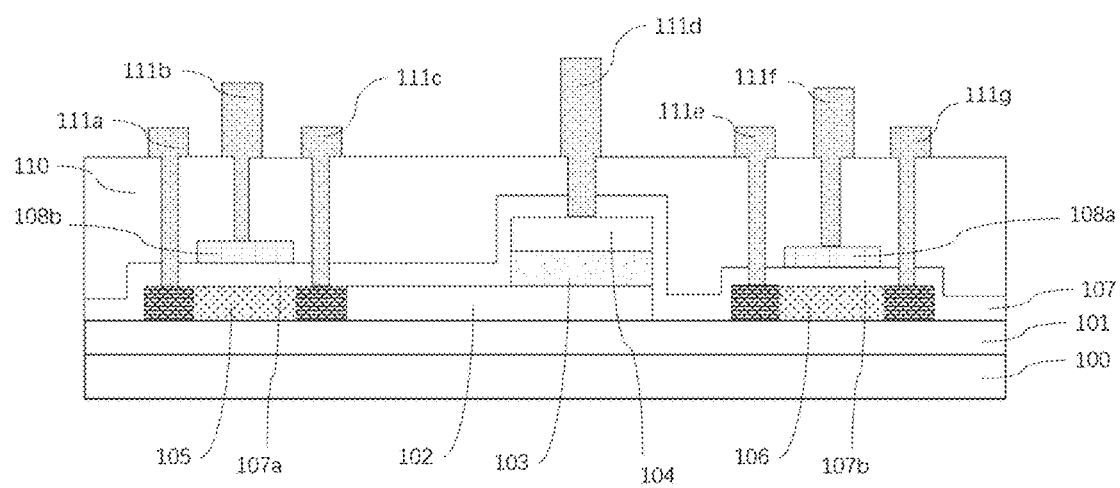
FIG. 10 is a structural schematic diagram of a non-volatile ferroelectric capacitor provided by the present disclosure.

Specifically, FIG. 3 is an equivalent circuit diagram of a ferroelectric capacitor integrated into an active-matrix organic light-emitting diode (AMOLED) driving circuit. As shown in FIG. 3, a display driving circuit provided by the present disclosure includes a selection thin-film transistor 1 (TFT1), a ferroelectric capacitor ($C_{FE}$) and a driving TFT2.

A gate electrode of the selection TFT1 is connected to a scan line, a source electrode of the selection TFT1 is connected to a data line, a drain electrode of the selection TFT1 is connected to the $C_{FE}$, both ends of the $C_{FE}$ are respectively connected to the source electrode and the gate electrode of the driving TFT2, and the drain electrode of the driving TFT2 is grounded.

The selection TFT1 is configured to control the gray scale of a liquid crystal unit, the $C_{FE}$ is configured for non-volatile storage, and the electric charge stored therein or the voltages at both ends thereof are determined by the amount of electricity charged when the selection TFT1 is turned on. When the selection TFT1 is turned off, it is still capable of controlling a potential difference between the gate electrode and the source electrode of the driving TFT2, controlling the opening and closing of the driving TFT2, controlling the current sizes of the source electrode and the drain electrode of the driving TFT2, and further controlling the gray scale of an OLED layer. The ferroelectric polarization charge in the $C_{FE}$ is still preserved when the selection TFT1 is turned off, so that the written image can be maintained.

Further, the driving TFT2 is capable of generating a large enough source-drain current for a driving OLED unit to emit light; and in this embodiment, the display driving circuit further includes an OLED structure, which is a self-luminous unit.

Embodiment 3

In this embodiment, the present disclosure provides a non-volatile ferroelectric capacitor, including:
a substrate 100;
a ferroelectric capacitor, which is formed in the middle of a surface of the substrate 100; a first channel layer 105 and a second channel layer 106, which are respectively formed on both sides of the surface of the substrate 100;
the ferroelectric capacitor includes a bottom electrode 102, a ferroelectric thin film 103 and a top electrode 104, which are sequentially arranged in a stacked manner, where the first channel layer 105 is in contact with the bottom electrode 102;
a dielectric material 107 is formed on the surfaces of the ferroelectric capacitor, the first channel layer 105 and the second channel layer 106;
a first gate electrode 108a and a second gate electrode 108b are formed on the surface of the dielectric material 107, such that the structure of the ferroelectric capacitor is formed, and a passivation layer 110 is deposited on the structure of the ferroelectric capacitor;
the first gate electrode 108a is directly opposite to the first channel layer 105, and the second gate electrode 108b is directly opposite to the second channel layer 106; and an area of the first gate electrode 108a is smaller than the area of the first channel layer 105, and the area of the second gate electrode 108b is smaller than the area of the second channel layer 106;
the structure of the ferroelectric capacitor is provided with a first groove and a second groove, where the first channel layer 105 is at the bottom of the first groove and the second groove;
the first gate electrode 108a is at the bottom of the third groove;
a fourth groove and a fifth groove, where the second channel layer 106 is at the bottom of the fourth groove and the fifth groove;
a sixth groove, where the second gate electrode 108b is at the bottom of the sixth groove;
a seventh groove, where the top electrode 104 is at the bottom of the seventh groove; and
metal is deposited in the first groove, the second groove, the third groove, the fourth groove, the fifth groove, the sixth groove and the seventh groove, and extends to the outside of the grooves to obtain a non-volatile ferroelectric capacitor.

Optionally, the substrate 100 includes a glass sheet, a flexible mica sheet, a Polydimethylsiloxane (PDMS) substrate, a polyimide (PI) substrate, or a quartz sheet.

A buffer layer is arranged between the substrate and the ferroelectric capacitor; and the buffer layer is made of one of silicon nitride, silicon oxide and aluminum oxide, or is a substrate interface layer obtained after treatment with plasmas is arranged.

The bottom electrode 102 is made of one of Pt, Ir, W, Ni, TiN, TaN, HfNx, ITO, ZnO, poly-Si, silver nanowires, graphene and electrode materials with good conductivity.

The ferroelectric thin film 103 is made of one of hafnium oxide-based ferroelectric materials, PZT, SBT, PVDF, BNT, etc.

The top electrode 104 is made of one of Pt, Ir, W, Ni, TiN, aN, HfNx, ITO, ZnO, poly-Si, silver nanowires and graphene.

The first channel layer 105 and the second channel layer 106 are made of semiconductor materials with good light transmittance performance such as amorphous silicon, poly-silicon, ZnO, IGZO, IZO, AZO and carbon nanotubes.

The dielectric material 107 is made of one or more of $SiO_2$, $Si_3N_4$, $HfO_2$, $ZrO_2$, $Al_2O_3$, $La_2O_3$, $Y_2O_3$ and $TiO_2$.

The first gate electrode 108a and the second gate electrode 108b are made of one of Pt, Ir, W, Ni, TiN, TaN, HfNx, ITO, ZnO, poly-Si, silver nanowires and graphene.

Embodiment 4

In this embodiment, the present disclosure provides a method for preparing a non-volatile ferroelectric capacitor, and the method includes the following steps:

S1: A clean substrate 100 is selected, a buffer layer 101 is deposited on a surface of the substrate 100, and then a ferroelectric capacitor is deposited in the middle of the surface of the buffer layer 101; the ferroelectric capacitor includes a bottom electrode 102, a ferroelectric thin film 103 and a top electrode 104, which are sequentially arranged in a stacked manner; and the ferroelectric thin film 103 and the top electrode 104 are etched to expose a portion of the bottom electrode 102.

Optionally, the substrate 100 includes a glass sheet, a flexible mica sheet, a Polydimethylsiloxane (PDMS) substrate, a polyimide (PI) substrate, or a quartz sheet. A buffer layer 101 is a substrate interface layer obtained after treatment with silicon nitride, silicon oxide, aluminum oxide or plasmas.

The bottom electrode 102 is made of one of Pt, Ir, W, Ni, TiN, TaN, HfNx, ITO, ZnO, poly-Si, silver nanowires, graphene and other electrode materials with good conductivity.

The ferroelectric thin film 103 is made of one of hafnium oxide-based ferroelectric materials, PZT, SBT, PVDF, BNT, etc.

The top electrode 104 is made of one of Pt, Ir, W, Ni, TiN, aN, HfNx, ITO, ZnO, poly-Si, silver nanowires and graphene.

S2: A first channel layer 105 and a second channel layer 106 are deposited on both sides of the surface of the buffer layer 101, the first channel layer 105 is in contact with an exposed portion of the bottom electrode 102.

Optionally, the first channel layer 105 and the second channel layer 106 are made of semiconductor materials with good light transmittance performance such as amorphous silicon, polysilicon, ZnO, IGZO, IZO, AZO and carbon nanotubes.

S3: A dielectric material 107 is deposited on the buffer layer 101, the first channel layer 105, the exposed portion of the bottom electrode 102, the top electrode 104 and the second channel layer 106.

Optionally, the dielectric material 107 is made of one or more of $SiO_2$, $Si_3N_4$, $HfO_2$, $ZrO_2$, $Al_2O_3$, $La_2O_3$, $Y_2O_3$ and $TiO_2$.

S4: A first gate electrode 108a and a second gate electrode 108b are deposited on the dielectric material 107, where the first gate electrode 108a is directly opposite to the first channel layer 105, and the second gate electrode 108b is directly opposite to the second channel layer 106; and an area of the first gate electrode 108a is smaller than the area of the first channel layer 105, and the area of the second gate electrode 108b is smaller than the area of the second channel layer 106.

Optionally, the first gate electrode 108a and the second gate electrode 108b are made of one of Pt, Ir, W, Ni, TiN, TaN, HfNx, ITO, ZnO, poly-Si, silver nanowires and graphene.

S5: The structure obtained in the S4 is annealed after ion implantation.

Optionally, types of implanted ions can be selected according to the types of materials of the first channel layer 105 and the second channel layer 106, and the implanted ions are generally As, P and B ions and the like. Those skilled in the art can select an appropriate annealing and crystallization process according to the type and preparation process of the ferroelectric material for the ferroelectric capacitor.

Annealing after the ion implantation is capable of crystallizing the ferroelectric material to form a ferroelectric phase, activating the ions in the source and drain regions of the transistor, repairing crystal lattices and forming a region with a high doping concentration.

Preferably, annealing can also be performed after the S1.

S6: Etching is performed after a passivation layer 110 is deposited on the structure obtained in the S5 to obtain a first groove, a second groove, a third groove, a fourth groove, a fifth groove, a sixth groove and seventh groove; metal is deposited in the first groove, the second groove, the third groove, the fourth groove, the fifth groove, the sixth groove and the seventh groove, to obtain a non-volatile ferroelectric capacitor; the first channel layer 105 is at the bottom of the first groove and the second groove; the first gate electrode 108a is at the bottom of the third groove; the second channel layer 106 is at the bottom of the fourth groove and the fifth groove; the second gate electrode 108b is at the bottom of the sixth groove; and the top electrode 104 is at the bottom of the seventh groove.

Optionally, the passivation layer 110 is made of $SiO_2$, $Si_3N_4$, etc., which functions as electrical isolation between devices and provides a flat surface for metal wiring. After the passivation layer 110 is deposited, planarization is required to further ensure the flatness of the surface, and then etching is performed. The etching process is implemented by photolithography or other graphic techniques.

The first groove, the second groove, and the third groove correspond to a source electrode, a drain electrode and a gate electrode of the transistor respectively; the fourth groove, the fifth groove and the sixth groove also correspond to a source electrode, a drain electrode and a gate electrode of the transistor respectively; and the seventh groove corresponds to the top electrode of the non-volatile ferroelectric capacitor.

Specifically, the first groove, the second groove, and the third groove correspond to a source electrode 111a, a drain electrode 111c and a gate electrode 111b of a selection thin-film transistor 1 (TFT1) respectively; the fourth groove, the fifth groove and the sixth groove correspond to a source electrode 111e, a drain electrode 111g and a gate electrode 111f of a driving TFT2 respectively; and the seventh groove corresponds to a top electrode 111d of the non-volatile ferroelectric capacitor, and through the metal wiring of the drain electrode 111c of the selection TFT1, the bottom electrode of the ferroelectric capacitor can also be controlled.

Optionally, the metal is made of TiN, Cu, Al, W, Co, Ni and other materials. Preferably, in order to improve the adhesion between the metal and a sidewall of the groove, a layer of Ti, TiN or other metal with good adhesion can be deposited on a wall surface of the groove in advance, and then the metal is deposited.

Embodiment 5

In this embodiment, the present disclosure provides a display driving circuit, which is different from the display driving circuits in the prior art. Specifically, in this embodiment, the ferroelectric capacitor obtained in Embodiment 4 is integrated into the display driving circuit. The characteristics of a ferroelectric thin film material in the non-volatile ferroelectric capacitor enable that a polarization state pre-written after an electric field is removed can still be saved, which realizes non-volatile display while reducing the power consumption of screen display.

Specifically, a source electrode 111a of a selection thin-film transistor 1 (TFT1) is connected to a data line, a gate electrode 111b of the TFT1 is connected to the scan line, a top electrode 111d of the ferroelectric capacitor and a gate electrode 111f of a driving TFT2 form an electrical connection through subsequent metal wiring, a drain electrode 111c of the selection TFT1 and a source electrode 111e of the driving TFT2 form an electrical connection through the subsequent metal wiring, which is further connected to a VDD power line of a control terminal; and a drain electrode 111g of the driving TFT2 is connected to an organic light-emitting diode (OLED) light-emitting unit.

Optionally, in order to improve the brightness of an active-matrix organic light-emitting diode (AMOLED) display, the OLED light-emitting unit is usually arranged above the ferroelectric capacitor.

Figure 11:
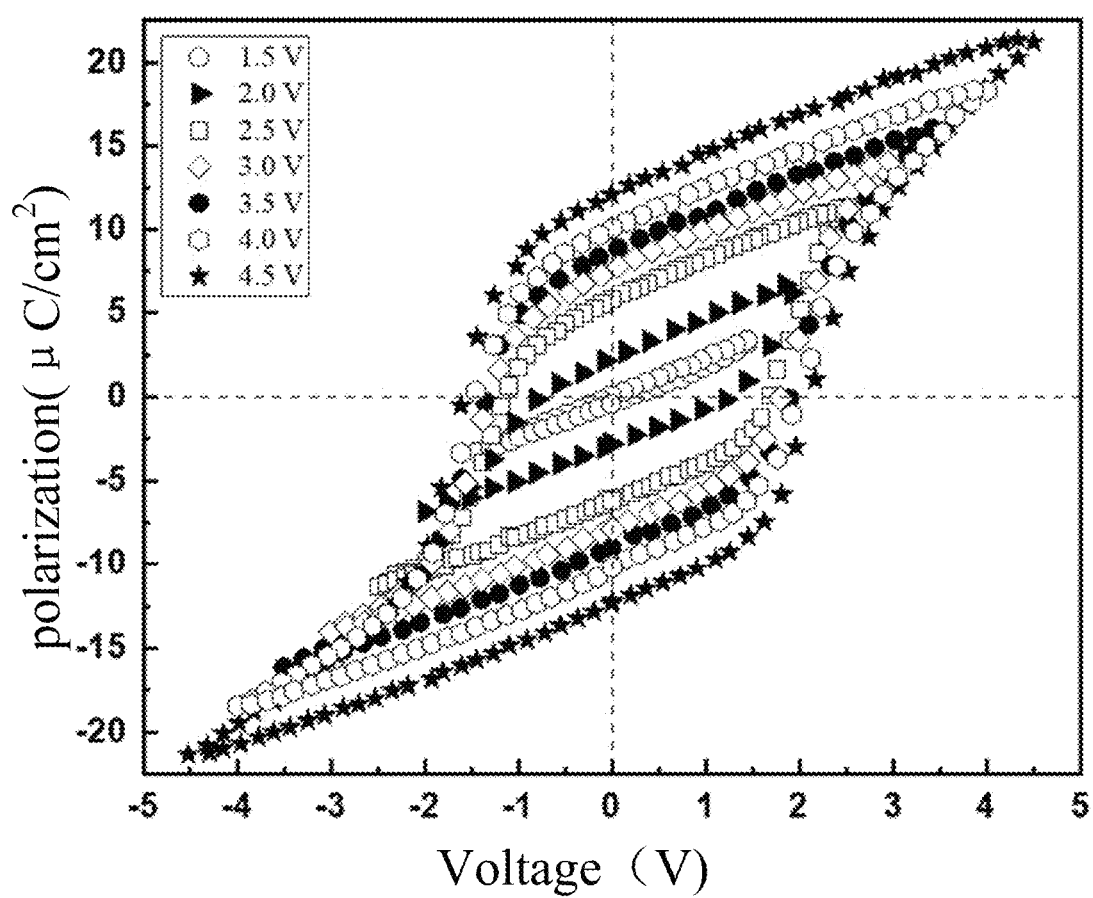
FIG. 11 is a polarization-voltage curve of a hafnium oxide-based ferroelectric capacitor provided by the present disclosure.
Figure 12:
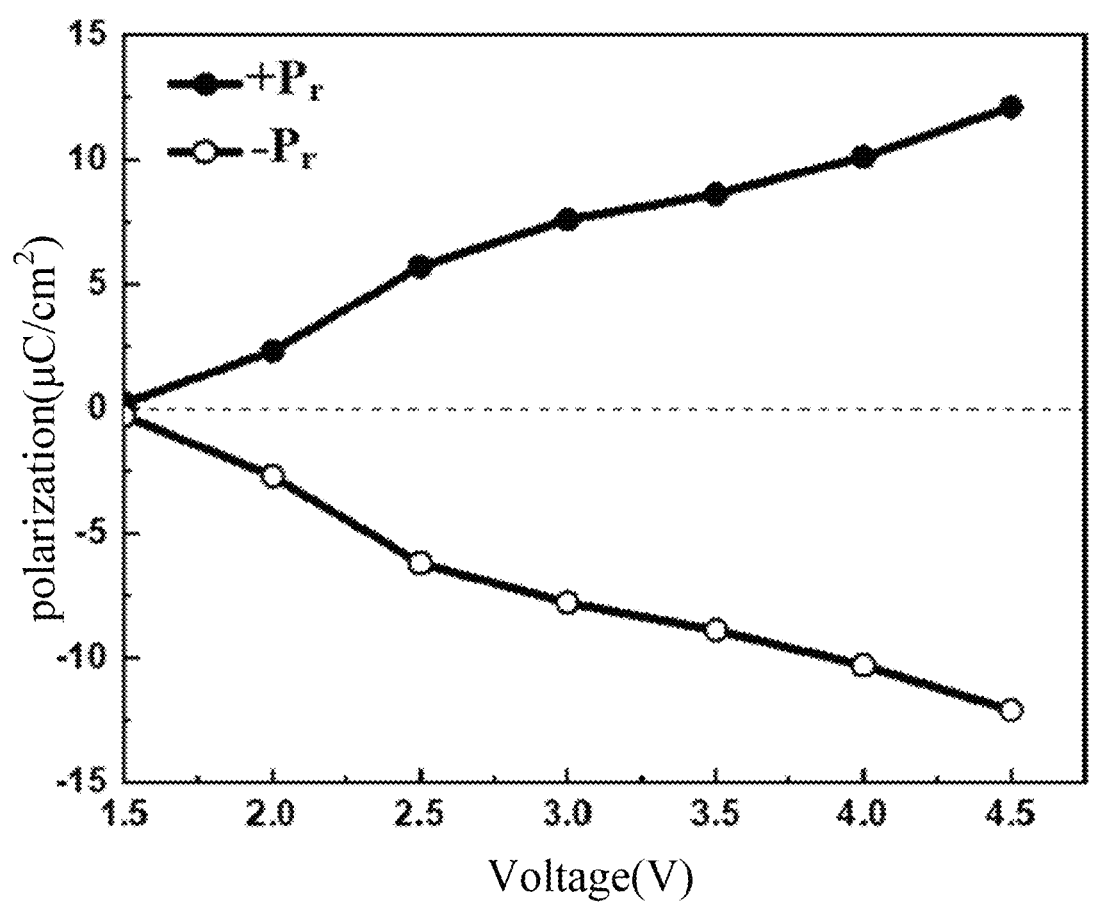
FIG. 12 is a relationship diagram of remanent polarization-applied voltage provided by the present disclosure.

FIG. 11 is a polarization-voltage curve of a hafnium oxide-based ferroelectric capacitor provided by the present disclosure. It can be seen that remanent polarization increases with an increase of an applied voltage. FIG. 12 is a relationship diagram of remanent polarization-applied voltage provided by the present disclosure, which shows that there is a good linear relationship between the remanent polarization and the voltage of the ferroelectric capacitor. By designing front-end parameter fitting and correction, linearity can be further improved, so that the data line voltage signal and the remanent polarization at both ends of the ferroelectric capacitor, as well as the gate-source voltage and source-drain current of the TFT2 maintain a continuous linear adjustable relationship, and the OLED unit can present a linear, continuous, uniform and controllable gray scale.

It is to be understood that the above specific embodiments in the present disclosure are for illustrative description or explanation of principles of the present disclosure only and not limitation of the present disclosure. Therefore, any modifications, equivalent substitutions, improvements, etc. without departing from the spirit and scope of the present disclosure are intended to be included within the scope of protection of the present disclosure. Furthermore, it is intended that the appended claims cover all variation and modifications that fall within the scope and boundaries of the appended claims or the equivalents of such scopes and boundaries.

What it claimed is:

1. A non-volatile ferroelectric capacitor, comprising:
a substrate;
a ferroelectric capacitor, which is formed in a middle of a surface of the substrate; a first channel layer and a second channel layer, which are respectively formed on both sides of the surface of the substrate;
the ferroelectric capacitor comprises a bottom electrode, a ferroelectric thin film and a top electrode, which are sequentially arranged in a stacked manner, wherein the first channel layer is in contact with the bottom electrode;
a dielectric material is formed on surfaces of the ferroelectric capacitor, the first channel layer and the second channel layer;
a first gate electrode and a second gate electrode are formed on a surface of the dielectric material, such that a structure of the ferroelectric capacitor is formed;
the structure of the ferroelectric capacitor is provided with a first groove, a second groove, a third groove, a fourth groove, a fifth groove, a sixth groove and a seventh groove;
the first channel layer is at the bottom of the first groove and the second groove;
the first gate electrode is at the bottom of the third groove;
the second channel layer is at the bottom of the fourth groove and the fifth groove;
the second gate electrode is at the bottom of the sixth groove; and
and the top electrode is at the bottom of the seventh groove.

2. The non-volatile ferroelectric capacitor according to claim 1, wherein the first gate electrode is arranged in correspondence with the first channel layer, and the second gate electrode is arranged in correspondence with the second channel layer; and an area of the first gate electrode is smaller than an area of the first channel layer, and an area of the second gate electrode is smaller than an area of the second channel layer.

3. The non-volatile ferroelectric capacitor according to claim 1, wherein a passivation layer is deposited on the structure of the ferroelectric capacitor.

4. The non-volatile ferroelectric capacitor according to claim 1, wherein metal is deposited in the first groove, the second groove, the third groove, the fourth groove, the fifth groove, the sixth groove and the seventh groove.

5. The non-volatile ferroelectric capacitor according to claim 1, wherein the substrate comprises one of a glass sheet, a flexible mica sheet, a Polydimethylsiloxane (PDMS) substrate, a polyimide (PI) substrate, and a quartz sheet.

6. The non-volatile ferroelectric capacitor according to claim 1, wherein a buffer layer is arranged between the substrate and the ferroelectric capacitor; and the buffer layer is made of one of silicon nitride, silicon oxide and aluminum oxide, or is a substrate interface layer obtained after treatment with plasmas.

7. The non-volatile ferroelectric capacitor according to claim 1, wherein the bottom electrode is made of one of Pt, Ir, W, Ni, TiN, TaN, HfNx, ITO, ZnO, poly-Si, silver nanowires and graphene.

8. The non-volatile ferroelectric capacitor according to claim 1, wherein the ferroelectric thin film is made of one of hafnium oxide-based ferroelectric materials, PZT, SBT, PVDF and BNT.

9. The non-volatile ferroelectric capacitor according to claim 1, wherein the top electrode is made of one of Pt, Ir, W, Ni, TiN, aN, HfNx, ITO, ZnO, poly-Si, silver nanowires and graphene.

10. The non-volatile ferroelectric capacitor according to claim 1, wherein the first channel layer and the second channel layer are made of one of amorphous silicon, poly-silicon, ZnO, IGZO, IZO, AZO and carbon nanotubes.

11. The non-volatile ferroelectric capacitor according to claim 1, wherein the dielectric material is made of one or more of $SiO_2$, $Si_3N_4$, $HfO_2$, $ZrO_2$, $Al_2O_3$, $La_2O_3$, $Y_2O_3$ and $TiO_2$.

12. The non-volatile ferroelectric capacitor according to claim 1, wherein the first gate electrode and the second gate electrode are made of one of Pt, Ir, W, Ni, TiN, TaN, HfNx, ITO, ZnO, poly-Si, silver nanowires and graphene.

* * * * *